United States Patent [19]

Ruiz-del-Portal et al.

[11] Patent Number: 5,053,766
[45] Date of Patent: Oct. 1, 1991

[54] TELEMETERING SYSTEM FOR ELECTRICAL POWER CONSUMED BY VARIOUS USERS

[75] Inventors: Javier Ruiz-del-Portal; Luis Rodriquez-Navarrete, both of San Sebastian, Spain

[73] Assignees: Iberduero, S.A.; Angel Iglesias, S.A., both of Spain

[21] Appl. No.: 185,038

[22] Filed: Apr. 22, 1988

[30] Foreign Application Priority Data

Apr. 23, 1987 [ES] Spain .................... 8701182
Apr. 23, 1987 [ES] Spain .................... 8701183

[51] Int. Cl.$^5$ ............................ G08B 23/00
[52] U.S. Cl. ................. 340/870.02; 340/870.03; 340/870.12; 340/870.24; 340/310 R; 364/493; 379/106
[58] Field of Search ............ 340/870.02, 870.03, 340/870.12, 870.21, 870.24, 870.28, 870.29, 310 A, 310 R; 379/106, 107, 357; 364/483, 492, 493; 250/231 SE, 227, 231 R

[56] References Cited

U.S. PATENT DOCUMENTS

| | | | |
|---|---|---|---|
| 4,281,325 | 7/1981 | Jarva | 340/870.02 |
| 4,315,251 | 2/1982 | Robinson et al. | 340/870.03 X |
| 4,327,362 | 4/1982 | Hoss | 340/870.02 |
| 4,415,853 | 11/1983 | Fisher | 340/870.02 X |
| 4,446,462 | 5/1984 | Ouellette et al. | 340/870.03 X |
| 4,697,182 | 9/1987 | Swanson | 340/870.02 |
| 4,833,618 | 5/1989 | Verma et al. | 340/870.02 |

Primary Examiner—Ulysses Weldon
Attorney, Agent, or Firm—Lucas & Just

[57] ABSTRACT

The telemetering system for electrical power consumed by various users converts the units of electrical consumption for each user into signals which may be transmitted and may be read by the corresponding microprocessors, those of a group of users being sent to a concentrator with its corresponding microprocessor, memory and program in order to go, in a star structure, increasing in scale and volume, to other concentrators or reading equipment and be able to end up in a central computer of the electricity distributing company.

31 Claims, 3 Drawing Sheets

TELEMETERING SYSTEM FOR ELECTRICAL POWER CONSUMED BY VARIOUS USERS

BACKGROUND OF THE INVENTION

1. Field of the Invention

In daily practice, employees of electricity distributing companies need to go from floor to floor in order to periodically inspect the value shown on each meter in order to supply said information to the power station and to calculate the monthly or bimonthly receipt for the user.

The user is almost totally ignorant of what he has to pay for a specific period or whether there are errors or mistakes, and the company has difficulty in detecting errors, breakdowns or frauds.

2. Summary of the Invention

The system of the invention solves these problems by remotely centralizing the consumption data for the users and providing visual means of their consumption and verification of expenses to the users.

A system for centralizing data, signals, measurements and breakdowns has been developed with the aim of placing at the disposal of both the user and the electricity distributing company the data relating to individual consumption and to consumption with respect to houses or blocks of houses.

One of the components necessary for said system is a generated set of pulses which makes it possible to transmit to the system signals which correspond to the consumption which has taken place and has been measured "in situ" by the conventional meters.

Modification of the meters which have already been tested for so many years and which have already been manufactured and installed, would give rise to considerable costs. Therefore, the present invention relates to an assembly which does not change or enter into contact with the functioning of said meters.

The system of the present invention converts the units of electrical consumption for each user into signals which may be transmitted to and may be read by the corresponding microprocessors, those for a group of users being sent to a concentrator with its corresponding microprocessor, memory and program in order to go, in a star structure, increasing in scale and volume, to other concentrators or reading equipment and be able to end up in a central computer of the electricity distributing company.

The present invention relates to a telemetering system for electrical power consumed by various users who have previously been individually supplied with a conventional meter of the type comprising a disk whose revolutions are correlated with consumption, which comprises at least:

a) a pulse generator for each meter comprising means for detecting and metering the number of revolutions of the disk and means for sending, when said number of revolutions reaches a preset value, a consumption signal to b) meter concentrator equipment comprising a connection bus which connects together $b_1$) at least one analog/digital converter block which receives the signals from several pulse generators, $b_2$) a microprocessor with its program memory, $b_3$) duplicated non-volatile memory means, $b_4$) means for communicating with a central computer of the electrical distributing company or another part of the system, connected to c) reading equipment comprising a connection bus which connects together $c_1$) a microprocessor with its program memory, $c_2$) duplicated non-volatile memory means, $c_3$) clock means, $c_4$) first means for communicating with the central computer, which means receive the signals from several meter concentrators, $c_5$) second means for communicating with the central computer in order to supply the processed information to the computer.

It is also characterized in that each non-volatile memory will have available, for each user, a summing integrator without a reset to zero, for recording the total power consumed, with means for making it possible to initially adjust its reading to that of the user's meter with the aim that, during correct operation, the reading of the user's meter and that of the reading equipment coincide; it also has available partial integrators for each one of the tariffs and of the corresponding program in order to, at the end of each invoicing period, memorize the recording of the summing integrator by substituting the previous reading, memorize the net consumption per tariff and reset to zero at the end of each period, in order to check in each invoicing period whether the sum of the partial integrators coincides or not with the difference indicated on the summing integrator, indicating whether there is a fraud or breakdown, if this is not the case.

DESCRIPTION OF THE PREFERRED EMBODIMENT

Figure 1:
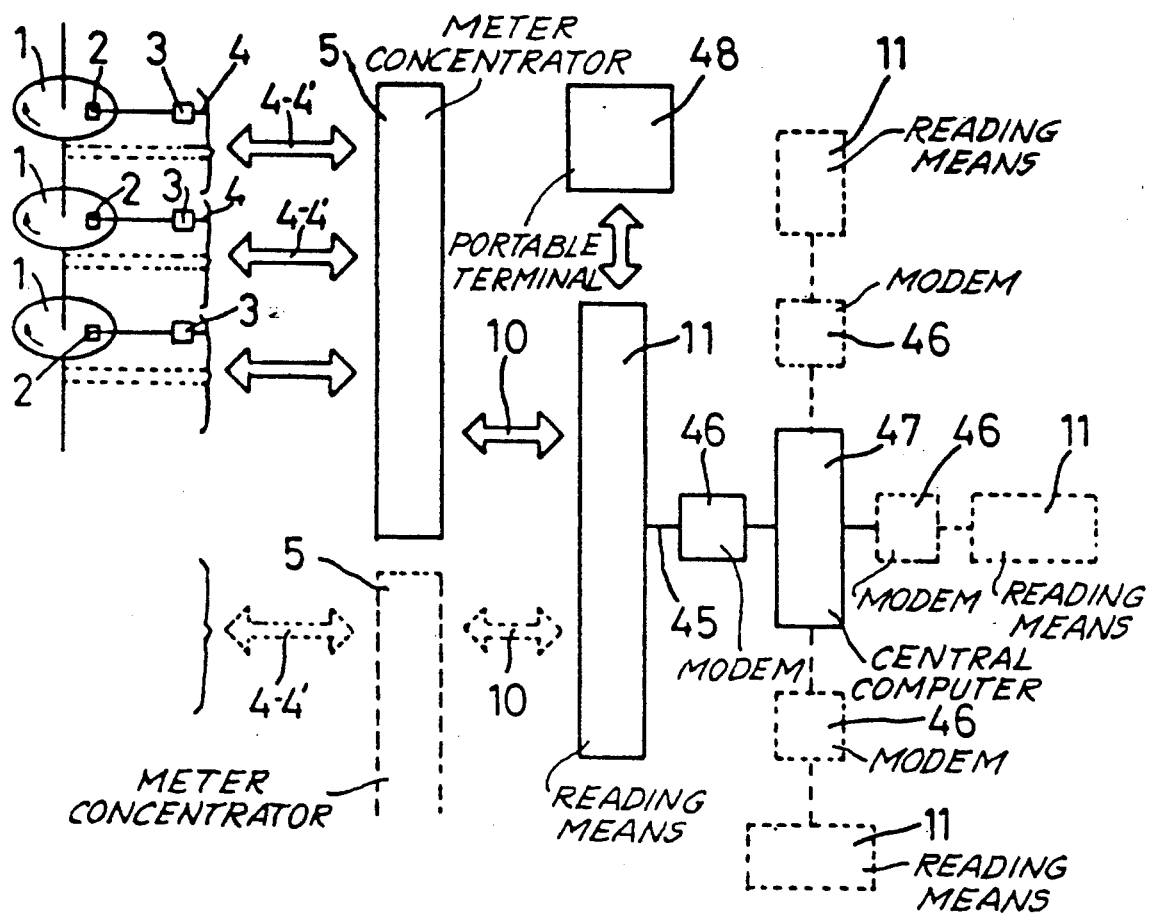
FIG. 1 is a block diagram of the assembly of the system which is the subject of the invention.
Figure 2:
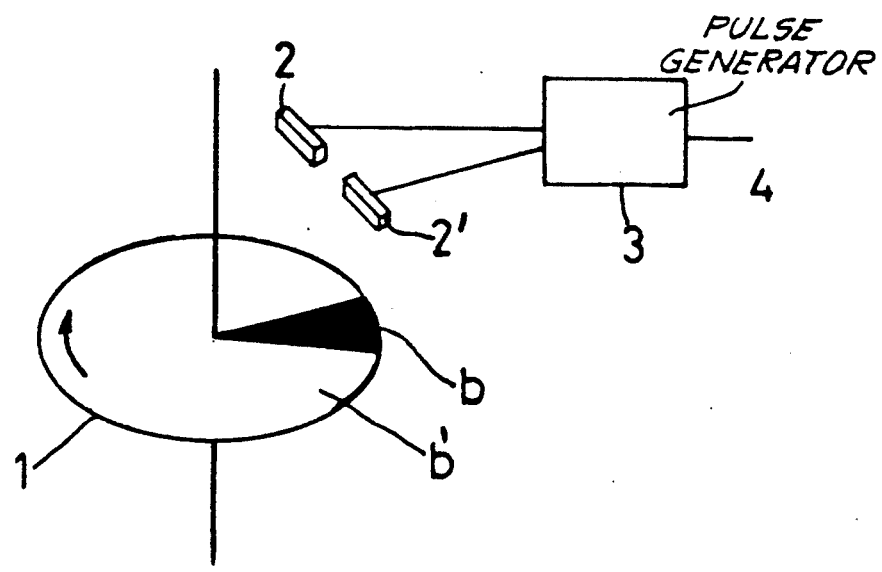
FIG. 2 is a diagrammatic view of the pulse generator assembly of FIG. 1.
Figure 3:
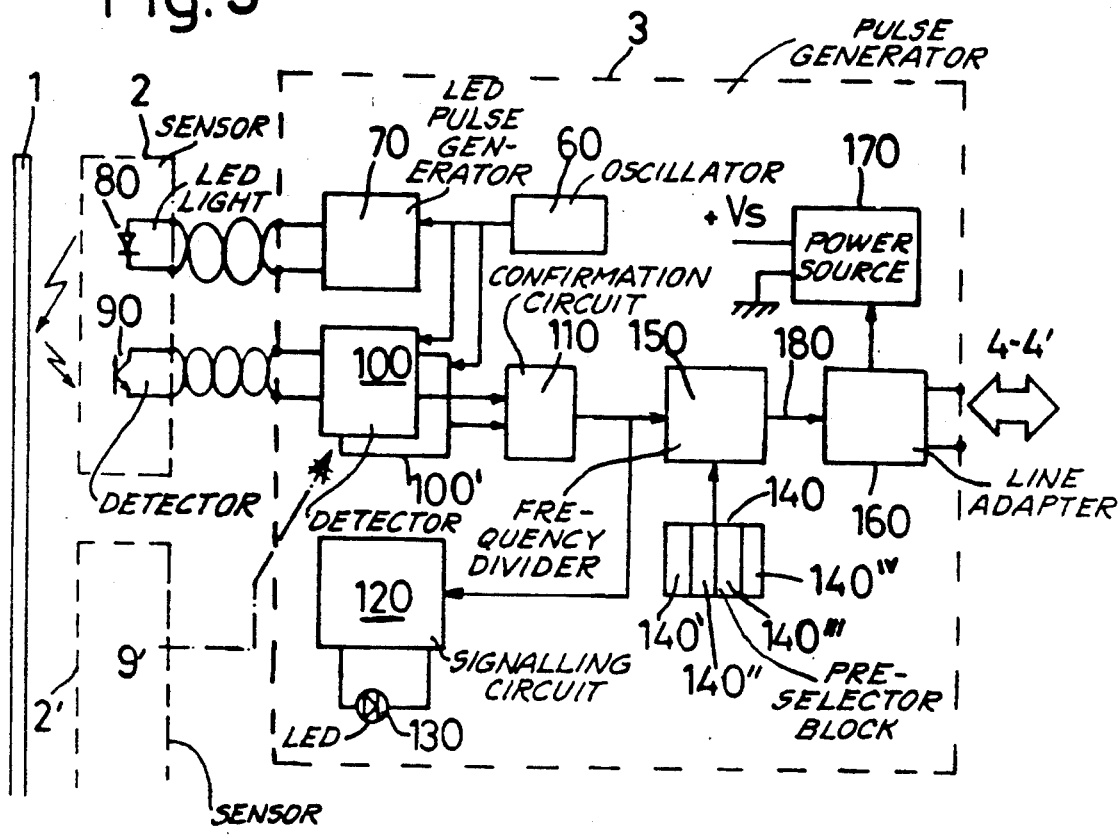
FIG. 3 is a block diagram of the assembly of FIG. 2.
Figure 4:
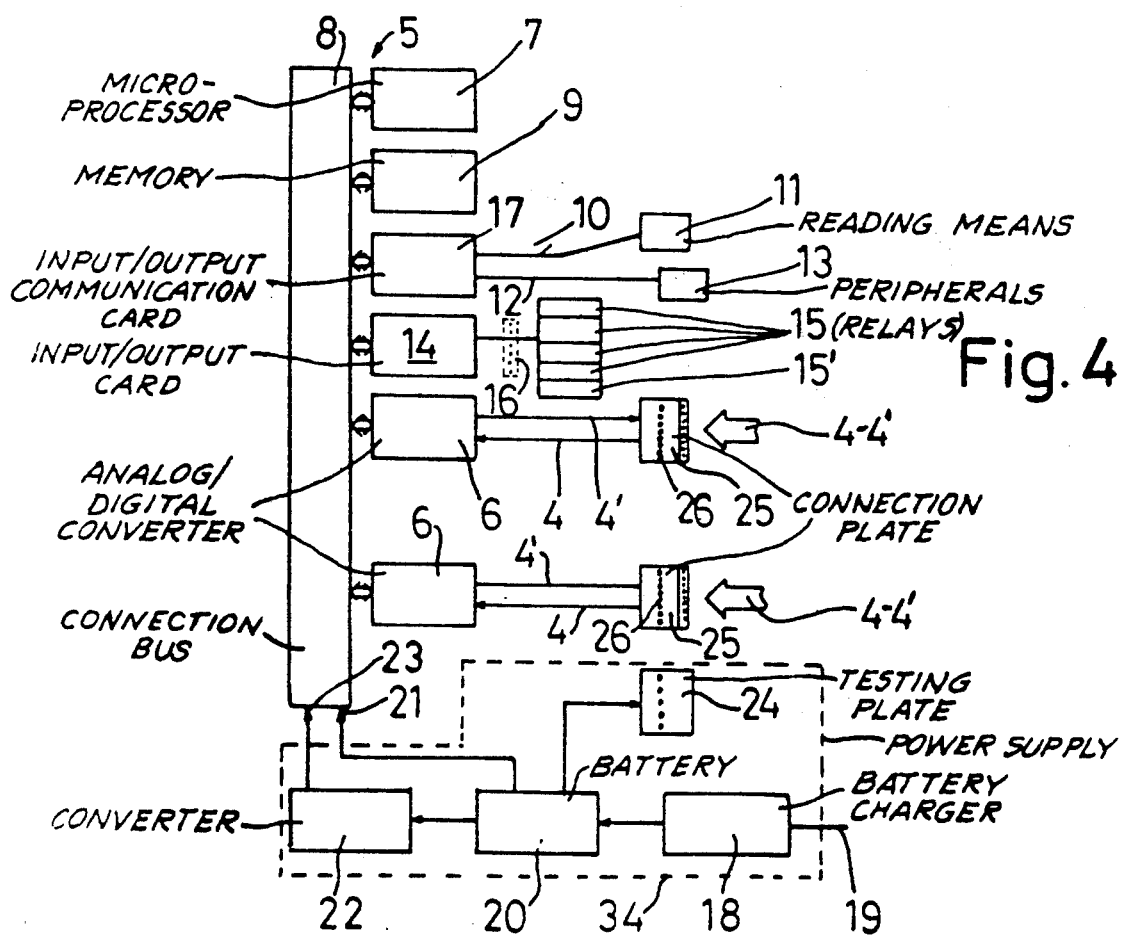
FIG. 4 is a block diagram of a meter concentrator of FIG. 1.
Figure 5:
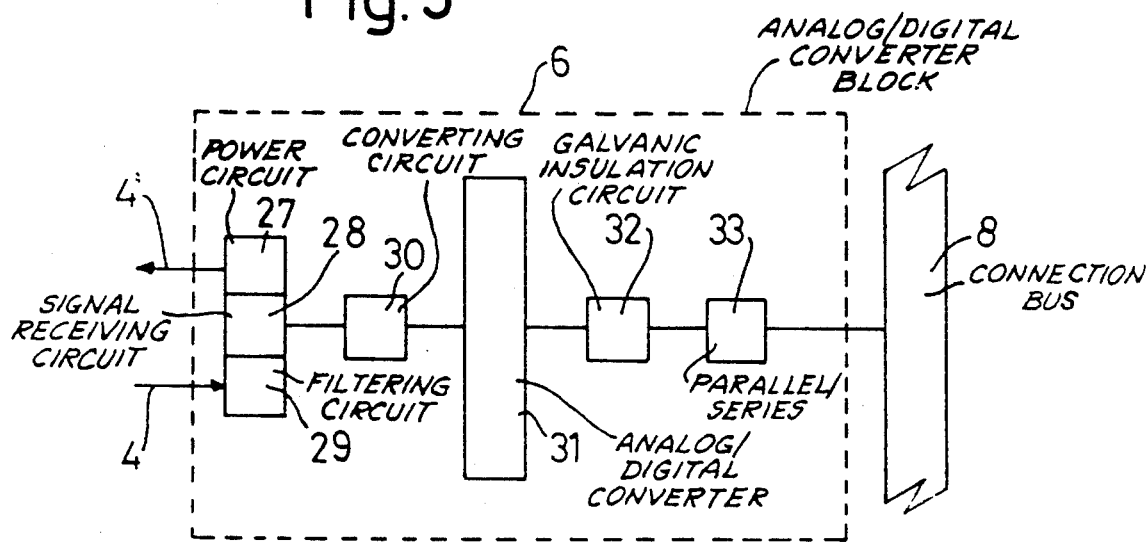
FIG. 5 is a block diagram of an analog/digital converter block of FIG. 4.
Figure 6:
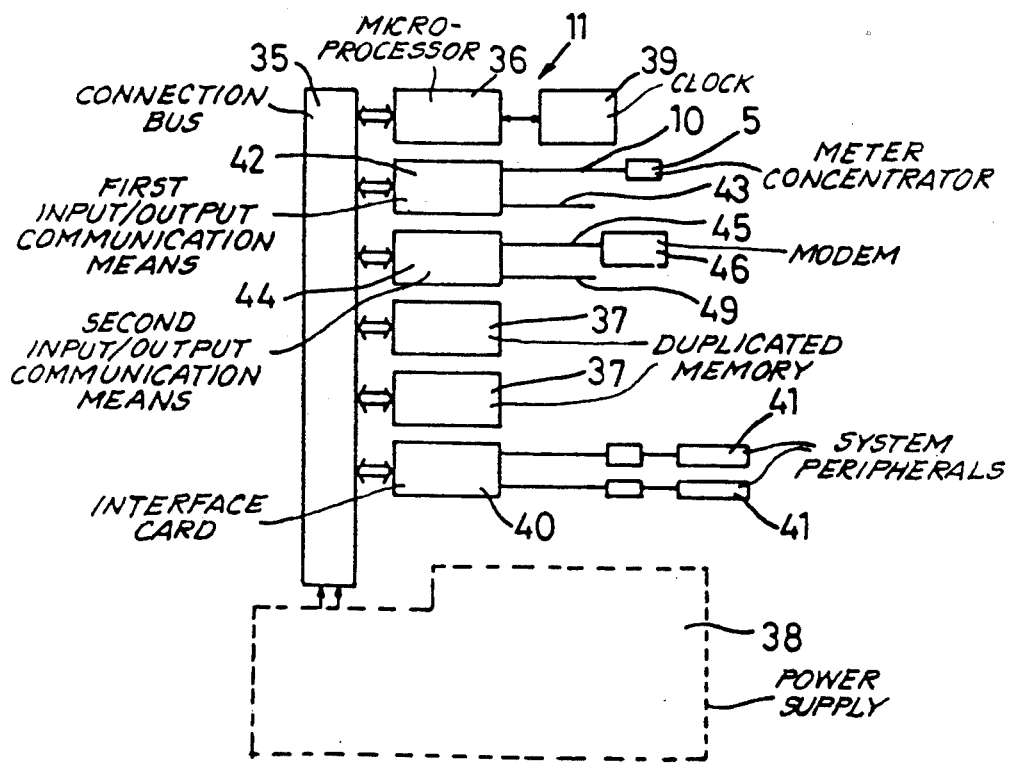
FIG. 6 is a block diagram of reading equipment of FIG. 1.

In conventional meters a correspondence is established between the power consumed and the number of revolutions made by one or more disks (1) similar to that represented in FIG. 1.

An attempt is made to provide on the outside of a conventional meter a signal (4) which retains a correlation with said consumed power.

On the disk (1) there is disposed a band (b) which is dark in relation to the rest of the disk, such that sensors (2) (2') may, detect when the dark region (b) or the light region (b) passes in front of them.

In this embodiment, the sensors (2), (2') are disk revolution readers (DRR) and, specifically, reflexive photodetectors.

The pulse generator (3) comprises a master oscillator (60) connected to an LED pulse generator (70) and to a detector of the dark band (100), (100') for each reflexive photodetector (2), (2').

The LED pulse generator (70) activates the LED (80) intermittently, extending the inactive period in order to avoid consumption.

The LED light (80) will encounter the dark band (b) or light region (b'), its reflection being detected by an infrared detector (90) which sends its signal to the dark band detector (100).

Given the slowness with which the disk (1) sometimes moves, the passage by the dark band (b) may give rise to distortions in the detection of its presence, all the more so when the LED (80) has to be inactive for a considerable proportion in time. Therefore, in order to be able to guarantee the direction of rotation of the disk (1) there is a second detector (2') identical to that described above and connected to it.

If the signals originating from the infrared detectors (90), (90') have a predetermined sequence of signals per consecutive passage of white/dark bands, the signal is sent to a signalling circuit (120) which supplies an LED (130) which is activated at each revolution of the disk (1).

The pulse generator (3) also comprises a preselector block (140) which may be of a mechanical, electrical or electronic nature, and in this case, with the aim of adapting it to the different types of meters already installed or on the market, four preselectors are used on which the operator will indicate the number of revolutions in integers (140'), (140''), (140''') and a decimal (140$^{IV}$) which the disk (1) has to make in order to determine that a predetermined amount of power such as, for example, 1 kWh or 0.1 kWh has been consumed.

The signal from the sensors (2), (2') corresponding to the detection of passes of dark band (b) is sent from the confirmation circuit (110) to a frequency divider (150) which counts the number of revolutions or signals received by sending the corresponding pulse (180) to a line adaptor (160) when the number of signals received coincides with the number of revolutions preset in the preselector (140).

For the decimal part, the frequency divider (150) has an accumulator for the preset decimal part which, when it reaches the unit in the summing process, feeds back to the input of the divider (150), with the result that power errors of a pulse are compensated for by the following pulses.

The line adaptor (160) is supplied with power from the outside (4'), in this case a concentrator, not shown, and sends it to the internal power source (170) such that the consumption of the pulse generator (3) has its own fixed and constant consumption (C).

The pulse (180) gives rise to a prefixed increase in the internal consumption (C'), by means of a calibrated current source.

The meter concentrator (5) detects that 1 kWh or any such prefixed amount of energy has been consumed when the meter concentrator detects the prefixed increase of internal consumption (C') from the adaptor (160).

The fixing of values for consumption at rest (C) and of consumption with pulse (C+C'), in addition to the fact that the signal detected by the adaptor (160) has, at the same time, a fixed and prefixed width prevents manipulations and fraud, since any other value for consumption or for pulse width is detected in the meter concentrator (5) and the corresponding warning or alarm is given.

The pulse emitted or a signal (4) correlated with it is detected and interpreted by the meter concentrator (5).

The meter concentrator (5) comprises several analog/digital converter blocks (6) which each receive the signals (4) from several meters (1).

Each meter concentrator (5) connects its components by means of a bus (8), said components being at least:

a control microprocessor (7) with its corresponding program memory;

non-volatile memories (9) which are duplicated for, fundamentally, reasons of security;

an input/output communication card (17) with two series lines, the first (10) being for its connection to reading equipment (11) and the second (12) for use by the peripherals (13) on the part of the electricity distributing company or on the part of the user; said peripherals (13) may be a printer, screen, checking and test means, etc.;

an input/output card (14) in parallel which regulates the opening/closing of relays (15). Each relay (15) corresponds to a specific tariff with the result that its opening/closing indicates, inter alia, to each user and to the company, by means of the corresponding LED (16), at which tariff it can consume power. A specific relay (15') can be dedicated to opening/closing a circuit previously set with special tariffs at specific times;

means for a supply which is autonomous (34) with respect to the operation of the network and which comprise, at least:

a battery charger (18) connected to the network (19) on the one hand, and on the other, to the batteries (20) which mainly supply the converter block (6) with a voltage (21) for supplying the pulse generators (3) via the line (4');

a continuous-continuous converter (22) which supplies the assembly of the concentrator with its working voltage (23);

LEDs (24) for signalling breakdowns in supply, battery operation, low battery, etc.

Each pulse generator (3) sends its corresponding signal (4) which indicates that there has been consumption of a predetermined unit of power and, by means of the converter block (6), the signal reaches the non-volatile memory (9) where, for each user, there is an accumulator for total figures and accumulators for partial figures for each tariff.

Between the pulse generators (3) and the converter block (6) there is a connection plate (25) comprising, at least, an LED (26) for each user which is activated momentarily by the CPU (7) each time that it receives the signal (4) for consumption of a unit. If the microprocessor (7), in its continuous dialog, detects a breakdown or fraud such as, for example, different consumption by the pulse generator (3) which is preset in accordance with the supply voltage (21) or different pulse width, etc., it can order that the LED (26) corresponding to said user should remain permanently activated, all this being in accordance with a preset program.

An analog/digital converter block (6) which is available, for example, for every eight users comprises:

a circuit (27) for providing each pulse generator (3) with the working voltage (21) by means of the line (4');

a circuit for receiving (28) the signal (4) correlated with each unit of consumption which originates in the pulse generator (3);

a circuit for filtering (29) said signal (4), said circuits (27), (28), (29) being able to distribute common elements in their functions;

a circuit for converting (30) the consumption signal into a voltage signal;

an analog/digital converter (31) for converting the different voltage signals into digital signals;

a galvanic insulation circuit (32) between the converter and the bus (8), for reasons of security;

a circuit for converting (33) parallel to series and vice versa in direct communication with the bus (8).

In the connection between the block converter (6) and the pulse generator there is a lamp test pulser which will activate all of them while it is pulsed, at the same time checking that the receiving circuits (28) of the converter block (6) are operating correctly.

The lines (4), (4') connecting to the pulse generator (3) may be short circuited.

The information (10) originating from several meter concentrators (5) is sent to reading equipment (11).

Each item of reading equipment (11) comprises the following elements which have a similar nature to those described for the meter concentrator.

a bus (35) for connecting the various elements;

a microprocessor (36) with its program memory;

duplicated non-volatile memories (37), for example, EEPROM;

autonomous supply means (38); and other elements such as the following:

a programmable calendar clock (39) with autonomous supply;

an interface card (40) making it possible for the user or the company to communicate with the assembly of the system from peripherals (41) such as a keyboard or a display;

a first card (42) for input/output of communication with two series lines, the first line (10) for communicating with the corresponding meter concentrator (5) and the second line (43) is for use by the electricity distributing company and which may be coupled to, for example, a screen;

a second card (44) similar to the first card (42) and having two series lines, the first line (45) possibly having at least two destinations:

a) it may be connected to a portable terminal (48) of a company employee who will, in this way, receive all the necessary information in a rapid and convenient manner, b) it may be connection to a modem (46) so that the reading equipment (11) can communicate with a central computer (47) by means of a telemetering/telesignal system.

If necessary, these two possibilities can be made compatible, with the second line (49) being for a peripheral, such as a printer.

Each non-volatile memory (37) will have for each user a summing integrator without reset to zero, for recording the total power consumed, with means for making it possible to initially adjust its reading to that of the user's meter with the aim that, during correct operation, the reading of the user's meter coincides with that of the reading equipment. It also has partial integrators for each one of the tariffs and of the corresponding program in order to, at the end of each invoicing period, memorize the recording of the summing integrator by substituting the previous reading, memorize the net consumption per tariff and reset to zero, at the end of each period, in order to check whether, in each invoicing period, the sum of the partial integrators coincides or not with the difference indicated on the summing integrator, indicating whether there is fraud or breakdown, if this is not the case.

Switching from one tariff to another is achieved as a function of the calendar clock and in accordance with the operating calendar and tariff timetable of the corresponding program.

On the basis of the information supplied by the reading equipment (11) to the portable terminals (48) or to the central computer (47), receipts for payment for each user are prepared.

We claim:

1. A telemetering system for electrical power consumption by individual users who previously have been supplied with a conventional meter of the type comprising a disk whose revolutions are correlated with consumption, the meter having at least one mark thereon, the system comprising:
   (a) a pulse generator for each meter comprising:
      (i) at least one optical sensor capable of detecting the passage of the mark during rotation of the disk and of sending a detection signal;
      (ii) a circuit for detecting the detection signal;
      (iii) a revolution preselector in which the number of revolutions of the disk is preset and corresponds to a predetermined quantity of power;
      (iv) a frequency divider which is connected to the revolution preselector and to the circuit for detecting the detection signal and which receives and meters the detection signal and sends a consumption signal to a line adaptor when the value of the signal from the detection signal corresponds to the quantity of power present in the revolution preselector;
      (v) the line adaptor sending the consumption signal to:
   (b) a meter concentrator comprising a connection bus which connects together:
      (i) at least one analog/digital converter block which receives the consumption signals from more than one pulse generator;
      (ii) a microprocessor with its program memory;
      (iii) duplicated non-volatile memory means;
      (iv) means for external communication having at least one series line, said series line being connected to:
   (c) reading means comprising a connection bus which connects together:
      (i) a microprocessor with its program memory;
      (ii) duplicated non-volatile memory means;
      (iii) clock means;
      (iv) first means for communicating with a central computer, which means receives the signals from at least two meter concentrators;
      (v) a second means for communication between the reading means and external peripherals.

2. The pulse generator of claim 1 comprising two optical sensors for each disk wherein the optical sensors are reflective object sensors which receive their activating pulse from a master oscillator and which send their signals to corresponding detectors and wherein, if the signals are received by the corresponding detectors in accordance a preselected sequence, the signals are sent to a confirmation circuit.

3. The system of claim 1 wherein each meter concentrator also comprises an input/output circuit which regulates the opening and/or closing of relays.

4. The system of claim 3 wherein each relay is associated with a signal for each meter which indicates at which meter and for which time period power has been consumed.

5. The system of claim 1 wherein each analog/digital converter block of each meter concentrator comprises:
   (a) means for supplying power to each pulse generator;
   (b) means for detecting the consumption signal and for sending the consumption signal to:
   (c) means for converting the consumption signal into a voltage signal.

6. The system of claim 5 wherein there is a galvanic insulation and a series/parallel and parallel/series conversion circuit between the converter block and the connection bus.

7. The system of claim 1 wherein each meter concentrator and each reading means have external power supply means.

8. The system of claim 7 wherein the external power supply means comprises a battery charger connected to an external power source, the battery charger also being connected to batteries.

9. The system of claim 1 wherein the duplicated non-volatile memory means comprises a total integrator and a partial integrator.

10. The system of claim 1 wherein the first communication means of the reading means comprises two series lines, the first for communicating with the meter concentrators and the second for communication with a central computer.

11. The system of claim 1 wherein the second communication means of the reading means comprises two series lines, the first connected to a modem for communication with a central computer and the second being connected to an external peripheral.

12. The pulse generator of claim 2 further comprising a signalling circuit with an LED connected to the output of the confirmation circuit.

13. The pulse generator of claim 1 wherein the frequency divider counts the revolutions of the disk and has a decimal accumulator.

14. The pulse generator of claim 1 wherein the line adaptor has means such that the pulse generator consumes a fixed and prefixed amount of power when the line adaptor does not receive a pulse from the frequency divider.

15. The pulse generator of claim 2 wherein the master oscillator is connected to an LED pulse generator and is also connected to the detectors of the signals from each optical sensor.

16. The pulse generator of claim 15 wherein the pulse of the LED pulse generator is asymmetric.

17. The pulse generator of claim 14 wherein the fixed and prefixed amount of power consumption is a signal having a fixed and prefixed width.

18. The pulse generator of claim 17 wherein the meter concentrator has means for detecting the fixed and prefixed amount of power and of determining whether it corresponds with the prefixed value and width.

19. The pulse generator of claim 1 wherein the preset value of the number of revolutions of the disk varies depending on the type of meter used.

20. The system of claim 1 wherein the second communication means of the reading means comprises means for communication between the reading means and a portable terminal.

21. The system of claim 1 wherein each meter concentrator and each reading means comprises at least one external peripheral.

22. The system of claim 1 wherein the reading means has a programmable calendar clock, the programmable calendar clock having an external power supply.

23. The system of claim 1 wherein the pulse generator comprises means for metering the number of revolutions of the disk connected to means for emitting a pulse when the metered number coincides with the preset number of revolutions for a unit of power consumption, and which is also connected to means for detecting the pulse and for varying the consumption by a prefixed value of the signal of the pulse generator and of producing a consumption signal.

24. The system of claim 23 wherein the consumption signal has a fixed and prefixed width.

25. The system of claim 9 wherein the meter concentrator has means in its microprocessor for detecting variation in consumption by comparing the amount of power consumption as totalled by the total integrator and as totalled by the partial integrator.

26. The system of claim 25 wherein each meter concentrator has means for detecting whether the lines connecting the pulse generators are open, closed, or short-circuited and whether any variation in consumption and width of pulse corresponds to prefixed values.

27. The system of claim 1 wherein the communication means of the meter concentrator comprises two series lines, one for connection to the reading means and the other for connection to an external peripheral.

28. The system of claim 3 wherein one of the relays opens and/or closes a circuit previously set with predetermined values.

29. The system of claim 28 wherein the opening and/or closing of each relay activates an LED.

30. The system of claim 1 wherein there is a connection plate with at least one LED per meter between the pulse generator and the converter block, the LED being momentarily activated by the meter concentrator microprocessor upon reception by the microprocessor of the consumption signal and being permanently activated if the consumption signal does not match a prefixed value.

31. The system of claim 30 wherein the connection plate has means such that a lamp test pulser may activate all of the LED's of the connection plate when the lamp test pulser is pulsed, and at the same time checks that the receiving circuits of the converter block are operating correctly.

* * * * *

UNITED STATES PATENT AND TRADEMARK OFFICE
CERTIFICATE OF CORRECTION

PATENT NO. : 5,053,766
DATED : October 1, 1991
INVENTOR(S) : Javier Ruiz-Del-Portal et al.

It is certified that error appears in the above-identified patent and that said Letters Patent are hereby corrected as shown below:

Column 2, line 60, after "may" delete ",".

Column 2, line 61, change "(b)" to --(b')--.

Column 5, line 34, delete "is".

Column 6, line 60, after "accordance" insert --with--.

Signed and Sealed this

Twenty-sixth Day of January, 1993

*Attest:*

DOUGLAS B. COMER

*Attesting Officer*  *Acting Commissioner of Patents and Trademarks*